(12) United States Patent
Grassmann et al.

(10) Patent No.: US 12,707,996 B2
(45) Date of Patent: Aug. 11, 2026

(54) SEMICONDUCTOR DEVICE MODULE COMPRISING FLEXIBLE LEADS FOR THE PURPOSE OF HEIGHT ADJUSTMENT

(71) Applicant: Infineon Technologies AG, Neubiberg (DE)

(72) Inventors: Andreas Grassmann, Regensburg (DE); Edward Fuergut, Dasing (DE); Uwe Schindler, Reichenbach (DE)

(73) Assignee: Infineon Technologies AG, Neubiberg (DE)

( * ) Notice: Subject to any disclaimer, the term of this patent is extended or adjusted under 35 U.S.C. 154(b) by 1051 days.

(21) Appl. No.: 17/873,909

(22) Filed: Jul. 26, 2022

(65) Prior Publication Data

US 2023/0035550 A1 Feb. 2, 2023

(30) Foreign Application Priority Data

Jul. 27, 2021 (DE) ......................... 102021119391.5

(51) Int. Cl.

| | |
|---|---|
| ***H10W 70/40*** | (2026.01) |
| ***H10W 40/22*** | (2026.01) |
| ***H10W 70/65*** | (2026.01) |
| ***H10W 74/10*** | (2026.01) |
| ***H10W 90/00*** | (2026.01) |

(52) U.S. Cl.

CPC ....... *H10W 70/479* (2026.01); *H10W 40/228* (2026.01); *H10W 70/65* (2026.01); *H10W 74/111* (2026.01); *H10W 90/00* (2026.01); *H10W 90/701* (2026.01)

(58) Field of Classification Search

CPC ..... H01L 2224/48091; H01L 23/49551; H01L 25/0655; H10W 70/479; H10W 70/65; H10W 74/111; H10W 90/00

See application file for complete search history.

(56) References Cited

U.S. PATENT DOCUMENTS

| | | | |
|---|---|---|---|
| 5,619,065 A | 4/1997 | Kim | |
| 10,037,935 B1 | 7/2018 | Pang et al. | |
| 10,074,590 B1 * | 9/2018 | Pavier | B60R 16/02 |
| 2005/0029634 A1 | 2/2005 | Ambrus | |
| 2006/0244344 A1 * | 11/2006 | Tanaka | H03B 5/36 310/344 |
| 2010/0264436 A1 | 10/2010 | Chuan et al. | |

(Continued)

FOREIGN PATENT DOCUMENTS

| | | |
|---|---|---|
| DE | 102015118245 A1 | 4/2017 |
| DE | 102018217831 A1 | 5/2019 |
| EP | 0970594 B1 | 12/2001 |

*Primary Examiner* — Matthew C Landau
*Assistant Examiner* — Halee Cramer
(74) *Attorney, Agent, or Firm* — Murphy, Bilak & Homiller, PLLC

(57) ABSTRACT

A semiconductor device module includes an application board, a plurality of semiconductor device packages disposed on the application board, each one of the semiconductor device packages including a semiconductor die, a leadframe including a plurality of leads, the leads including a spring support and a heat dissipation element, and an encapsulant embedding the semiconductor die and first portions of the leads, an external heatsink, and one or more thermally conductive interface layers disposed between the semiconductor device package and the heatsink.

18 Claims, 3 Drawing Sheets

(56) References Cited

U.S. PATENT DOCUMENTS

2017/0117208 A1* 4/2017 Kasztelan ........... H01L 21/4882
2019/0287883 A1 9/2019 Yao et al.
2020/0168531 A1 5/2020 Meyers et al.

* cited by examiner

SEMICONDUCTOR DEVICE MODULE COMPRISING FLEXIBLE LEADS FOR THE PURPOSE OF HEIGHT ADJUSTMENT

TECHNICAL FIELD

The present disclosure is related to a semiconductor device module and to a semiconductor device package.

BACKGROUND

In the semiconductor device industry there exist semiconductor device modules in which several semiconductor device packages need to be mounted on an application board like, for example, a printed circuit board (PCB). Usually on top of the semiconductor device packages a cooling component like a heatsink is mounted, in particular glued. After having the heatsink glued on top of the semiconductor device packages, all packages should be in the same level. There is, however, always a problem with a warping of the application board which leads to a varying distance between an upper surface of the application board and a lower surface of the heatsink.

In order to achieve a same level of the semiconductor device packages, attaching the heatsink is done by an external loading action. However, such external loading could possibly increase a risk of solder damage during application.

For these and other reasons there is a need of the present disclosure.

SUMMARY

A first aspect of the present disclosure is related to a semiconductor device module, comprising an application board, a plurality of semiconductor device packages disposed on the application board, each one of the semiconductor device packages comprising a semiconductor die, a leadframe comprising a plurality of spring supported leads, a heat dissipation element, and an encapsulant embedding the semiconductor die and first portions of the leads, an external heatsink, and one or more thermally conductive interface layers disposed between the semiconductor device package and the heatsink.

A second aspect of the present disclosure is related to a semiconductor device package comprising a semiconductor die, a leadframe comprising a plurality of leads and a heat dissipation element, and an encapsulant embedding the semiconductor die and first portions of the leads, wherein two or more recesses are formed in second portions of the leads which second portions are not embedded by the encapsulant, the being configured to induce or enhance a spring function of the leads.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DESCRIPTION OF EMBODIMENTS

In the following detailed description, reference is made to the accompanying drawings, which form a part hereof, and in which is shown by way of illustration specific embodiments in which the disclosure may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

Figure 1:
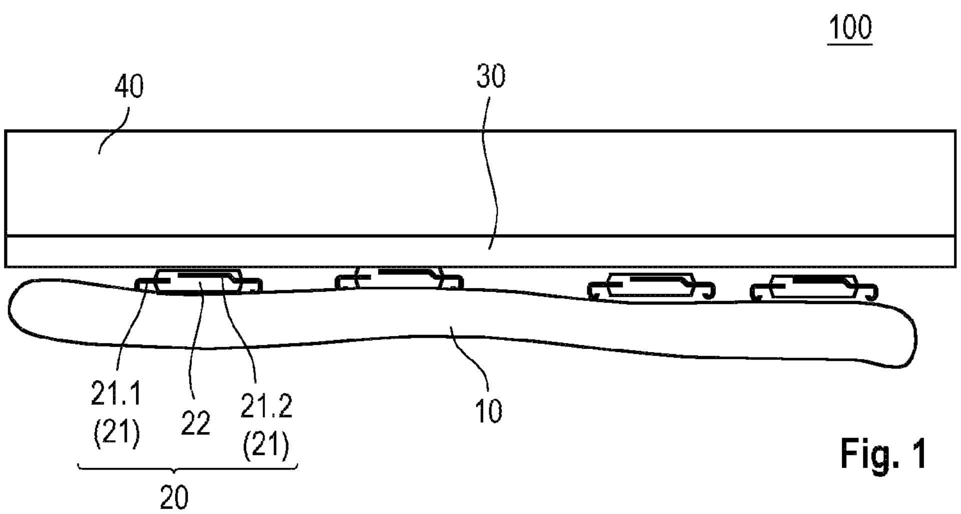
FIG. 1 shows an example of a semiconductor device module according to the first aspect in a cross-sectional side view, wherein the interface layer comprises one common interface layer which is disposed between each one of the semiconductor device packages and the heatsink.

FIG. 1 shows an example of a semiconductor device module according to the first aspect in a cross-sectional side view.

The semiconductor device module 100 of FIG. 1 comprises an application board 10, a plurality of semiconductor device packages 20 disposed on the application board 10, each one of the semiconductor device packages 20 comprising a semiconductor die, a leadframe 21 comprising a plurality of leads 21.1, the leads 21.1 comprising a spring function, a die carrier 21.2, and an encapsulant 22 embedding the semiconductor die and first portions of the leads 21.1.

The semiconductor device module 100 of FIG. 1 further comprises an external heatsink 40 and one common interface layer 30 which is disposed between each one of the semiconductor device packages 20 and the heatsink 40.

Figure 2:
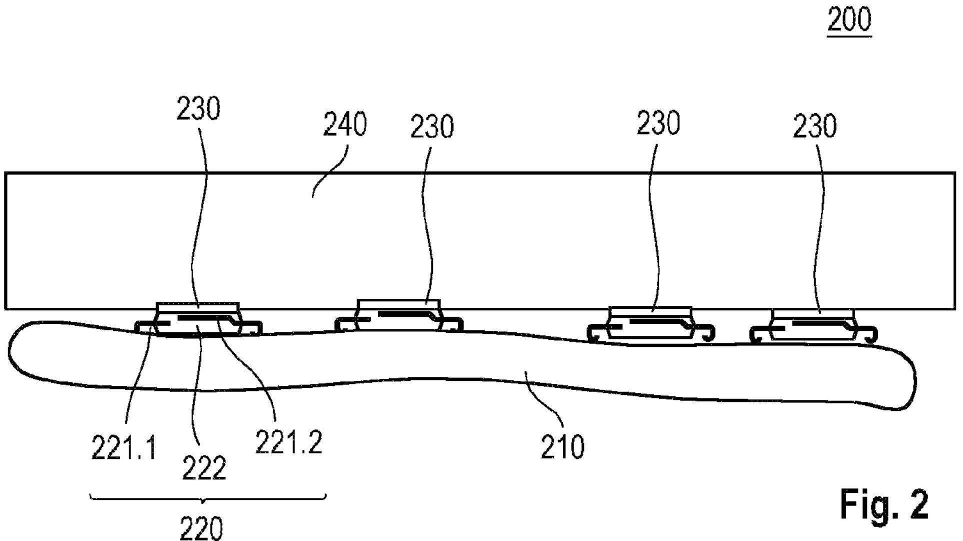
FIG. 2 shows an example of a semiconductor device module according to the first aspect in a cross-sectional side view, wherein the module comprises a plurality of interface layers wherein each one of the plurality of interface layers is disposed between one of the semiconductor device packages and the heatsink.

FIG. 2 shows another example of a semiconductor device module according to the first aspect.

The semiconductor device module 200 of FIG. 2 comprises an application board 210, a plurality of semiconductor device packages 220 disposed on the application board 210, each one of the semiconductor device packages 220 comprising a semiconductor die, a leadframe 221 comprising a plurality of leads 221.1, the leads 221.1 comprising a spring function, a die carrier 221.2, and an encapsulant 222 embedding the semiconductor die and first portions of the leads 221.1.

The semiconductor device module 200 of FIG. 2 further comprises an external heatsink 240 and a plurality of interface layers 230 wherein each one of the plurality of interface layers 230 is disposed between one of the semiconductor device packages 220 and the heatsink 240.

Figure 3A:
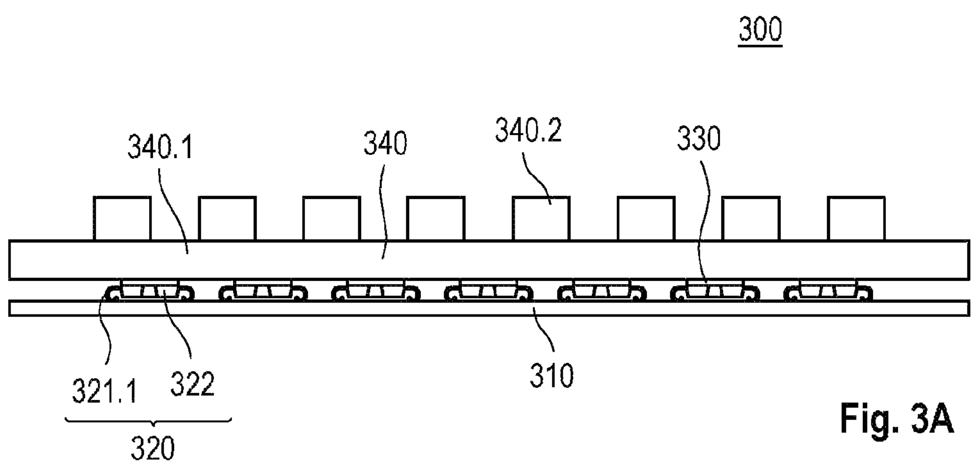
FIG. 3 comprises FIG. 3A and FIG. 3B and shows an example of a semiconductor device module according to the first aspect in a cross-sectional side view (A) and a perspective view (B) wherein the module comprises a plurality of interface layers wherein each one of the plurality of interface layers is disposed between one of the semiconductor device packages and the heatsink.
Figure 3B:
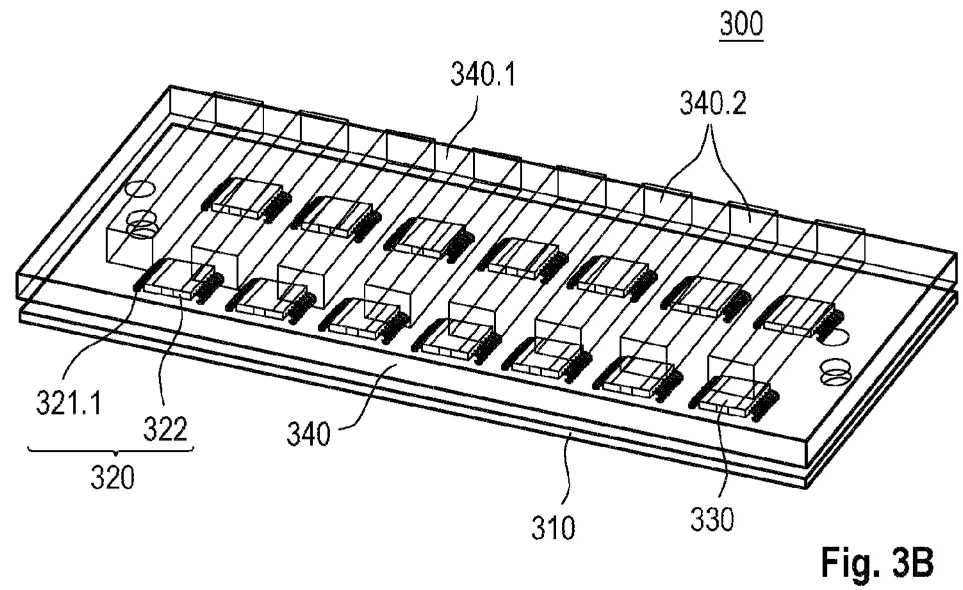

FIG. 3 comprises FIG. 3A and FIG. 3B and shows an example of a semiconductor device module according to the first aspect in a cross-sectional side view (A) and a perspective view (B).

The semiconductor device module 300 of FIG. 3 comprises an application board 310, a plurality of semiconductor device packages 320 disposed on the application board 310, each one of the semiconductor device packages 320 comprising a semiconductor die, a leadframe 321 comprising a plurality of leads 321.1, the leads 321.1 comprising a spring function, a die carrier, and an encapsulant 322 embedding the semiconductor die and first portions of the leads 321.1.

The semiconductor device module 300 of FIG. 3 further comprises an external heatsink 340 and a plurality of interface layers 330 wherein each one of the plurality of interface layers 330 is disposed between one of the semiconductor device packages 320 and the heatsink 340. The heatsink 340 comprises a base plate 430.1 and a plurality of fins 340.2 connected to the base plate 340.1.

All the embodiments shown in FIGS. 1 to 3 demonstrate the basic problem, namely a varying distance between an upper surface of the application board 10, 210, or 310 and a lower surface of the heatsink 40, 240, or 340 due to a warping of the application board 10, 210, or 310. Therefore in an initial state before starting the external loading on the heatsink 40, 240, or 340 there is also a varying distance between the upper surfaces of the semiconductor device packages 30, 230, or 330 and the lower surface of the heatsink 40, 240, or 340. Such an initial state is shown in the embodiment of FIG. 1 whereas in the embodiments as shown in FIGS. 2 and 3 the external loading has been finished and has resulted in equal heights of the semiconductor device packages 230 and 330 and equal distances between their upper surfaces and the lower surface of the heatsink 240 or 340.

Due to the present disclosure compensating the height differences is at least mainly achieved by the spring support of the leads and, if any, only to a lesser extent due to the compressibility of the interface layer(s). For the interface layer(s) relatively hard and rigid materials can be chosen, so that the materials have a compressibility of less than 10% or less than 8% or less than 5%.

During the external loading the leads, in particular the leads of the highest positioned packages, define the force with which the heatsink is pressed into the interface layer(s) which force can be in a range from 1 N to 20 N or even more than 20 N whereas the spring supported leads may comprise a spring deflection in a range between 100 μm and 500 μm or even more than 500 μm.

The spring support of the leads 21.1, 221.1, or 321.1 can be induced or enhanced by two or more recesses formed in second portions of the leads 21.1, 221.1, or 321.1 which second portions are not embedded by the encapsulant 22, 222, or 322. Specific examples therefore will be presented later in connection with FIGS. 4 and 5. Without the recesses the leads 21.1, 221.1 may or may not have a spring support so that the recesses either induce the spring support or enhance an already existing spring support.

Also as shown in the embodiments of FIGS. 1 to 3, the interface layer(s) 30, 230, or 330 can be directly attached to the upper main face of the semiconductor device package 20, 220, or 320 and directly attached to the lower main face of the heatsink 40, 240, or 340.

In the embodiments of FIGS. 1 to 3, the heat dissipation element is comprised in the form of a die carrier. However, the heat dissipation element need not necessarily be die carrier and instead be, for example, a clip or any other element with which excessive heat generated by the semiconductor die can be dissipated.

Also as shown in the embodiments of FIGS. 1 to 3, the die carrier 21.2 or 221.1 is exposed by the encapsulant 22 or 222. This is also not necessary as it could also be that the die carrier is covered by a layer, in particular, by the encapsulant, in particular by a heat conductive encapsulant.

Furthermore according to an embodiment of the semiconductor device module according to the first aspect the one or more interface layers 30, 230, or 330 comprise a material which comprises one or more elements out of a group consisting of a plastic, a silicone, a polyimide, a resin, and an epoxy resin.

Furthermore according to an embodiment of the semiconductor device module according to the first aspect the one or more interface layers 30, 230, 330 comprise a material matrix filled with filler particles, in particular filler particles comprising at least one of the group consisting of metal oxide, aluminum oxide, metal nitride, silicon oxide, boron nitride, zirconium oxide, silicon nitride, diamond, and aluminum nitride.

Furthermore as shown in the embodiments of FIGS. 1 to 3, the leads 21.1, 221.1, or 321.1 are formed as J-leads.

However, also gull wing leads or through-hole leads can be used which can also be provided a with a spring support.

Figure 4:
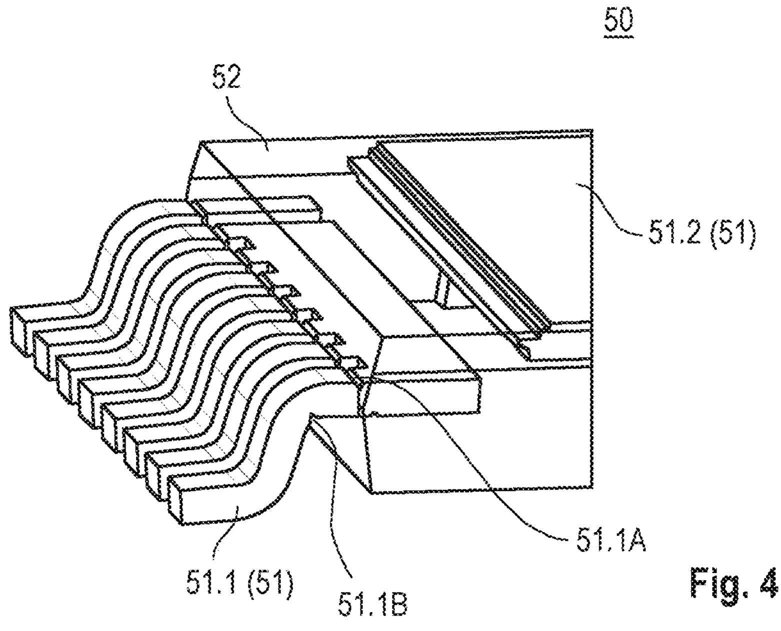
FIG. 4 shows a perspective view of a portion of a semiconductor device package according to the second aspect showing a row of gull wing leads of a leadframe, each one of the gull wings leads comprising two groove-like recesses.

FIG. 4 shows a perspective view of a portion of a semiconductor device package according to the second aspect.

The semiconductor device package 50 of FIG. 4 comprises a semiconductor die, a leadframe 51 comprising a plurality of gull wing leads 51.1 arranged in parallel in a row, a die carrier 51.2, and an encapsulant 52 embedding the semiconductor die and first portions of the leads 51.1. Furthermore two recesses 51.1A and 51.1B are formed in second portions of the leads 51.1 which second portions are not embedded by the encapsulant 52, the two recesses 51.1A and 51.1B are configured to induce or enhance a spring support of the leads 51.1.

More specifically, a first recess (51.1A) comprises the form of a groove 51.1A located on an upper surface of an upper horizontal portion of the lead 51.1 and a second recess 51.1B as well comprises the form of a groove 51.1B located on a lower surface of a bent portion between the upper horizontal portion and a downward portion of the lead 51.1.

In some embodiments a lowermost surface of the leads 51.1 lies in a plane which is located below a lowermost surface of the encapsulant 52.

Figure 5:
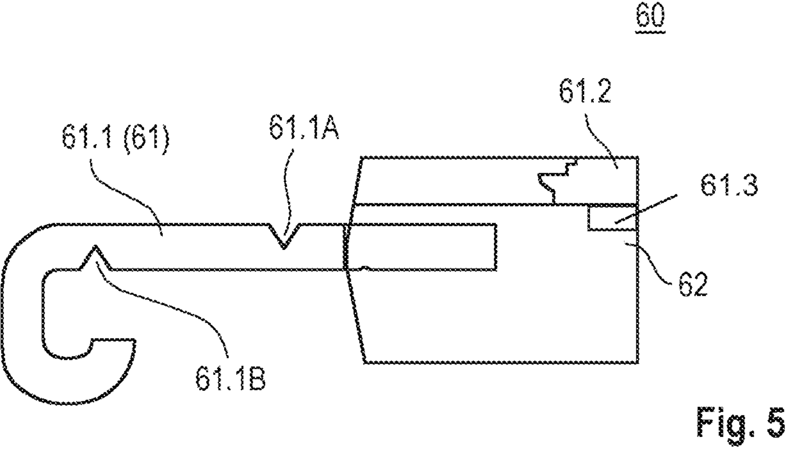
FIG. 5 shows a cross-sectional side view of a portion of a semiconductor device package showing a row of J-leads of a leadframe, each one of the J-leads comprising two groove-like recesses.

FIG. 5 shows a cross-sectional side view of a portion of a semiconductor device package according to the second aspect.

The semiconductor device package 60 of FIG. 5 comprises a semiconductor die, a leadframe 61 comprising a plurality of J-leads 61.1 arranged in parallel in a row like in FIG. 4, a die carrier 61.2, and an encapsulant 62 embedding the semiconductor die 61.3 and first portions of the leads 61.1. The J-leads 61.1 are Furthermore two recesses 61.1A and 61.1B are formed in second portions of the leads 61.1 which second portions are not embedded by the encapsulant 62, the two recesses 61.1A and 61.1B being configured to induce or enhance a spring support of the leads 51.1.

More specifically, each one of the leads 61.1 comprises a first recess 61.1A which comprises the form of a groove 61.1A located on an upper surface of an upper horizontal portion of the lead 61.1 and each one of the leads comprises a second recess 61.1B which comprises as well the form of a groove 61.1B located on a lower surface of the upper horizontal portion of the lead 61.1.

In some embodiments a lowermost surface of the leads 61.1 lies in a plane which is located below a lowermost surface of the encapsulant 62.

In the embodiments of semiconductor packages 50 or 60 in FIGS. 4 and 5, the heat dissipation element is comprised in the form of a die carrier 51.2 or 61.2. However, the heat dissipation element need not necessarily be die carrier and instead be, for example, a clip or any other element with which excessive heat generated by the semiconductor die 61.3 can be dissipated.

Also as shown in the embodiments of FIGS. 4 and 5, the die carrier 51.2 or 61.1 is exposed by the encapsulant 52 or 62. This is also not necessary as it could also be that the die carrier is covered by a layer, in particular, by the encapsulant, in particular by a heat conductive encapsulant.

It should further be mentioned that any examples, embodiments, features, comments, or remarks mentioned above in connection with a semiconductor device module of the first aspect can also be applied at a semiconductor device package according to the second aspect.

EXAMPLES

In the following specific examples of the present disclosure are described.

Example 1 is a semiconductor device module, comprising an application board, a plurality of semiconductor device packages disposed on the application board, each one of the semiconductor device packages comprising a semiconductor die, a leadframe comprising a plurality of spring supported leads, a heat dissipation element, and an encapsulant embedding the semiconductor die and first portions of the leads, an external heatsink, and one or more thermally conductive interface layers disposed between the semiconductor device package and the heatsink.

Example 2 is the semiconductor device module according to Example 1, wherein the spring support is induced or enhanced by two or more recesses formed in second portions of the leads which second portions are not embedded by the encapsulant.

Example 3 is the semiconductor device module according to Example 1 or 2, wherein the interface layer is directly attached to the upper main face of the semiconductor device package and directly attached to the lower main face of the heatsink.

Example 4 is the semiconductor device module according to anyone of the preceding Examples, wherein the interface layer comprises a compressibility of less than 10% or less than 8% or less than 5%.

Example 5 is the semiconductor device module according to anyone of the preceding Examples, wherein the heat dissipation element is exposed by the encapsulant.

Example 6 is the semiconductor device module according to anyone of the preceding Examples, wherein the heat dissipation element comprises a die carrier or a clip.

Example 7 is the semiconductor device module according to anyone of the preceding Examples, wherein the interface layer comprises one common interface layer which is disposed between each one of the semiconductor device packages and the heatsink.

Example 8 is the semiconductor device module according to any one of the preceding Examples, wherein the interface layer comprises a plurality of interface layers wherein each one of the plurality of interface layers is disposed between one of the semiconductor device packages and the heatsink.

Example 9 is the semiconductor device module according to any one of the preceding Examples, wherein the one or more interface layers are electrically insulating.

Example 10 is the semiconductor device module according to any one of the preceding Examples, wherein the one or more interface layers comprise a material which comprises one or more elements out of a group consisting of a plastic, a silicone, a polyimide, a resin, and an epoxy resin.

Example 11 is the semiconductor device module according to any one of the preceding Examples, wherein the one or more interface layers comprise a material matrix filled with filler particles, in particular filler particles comprising at least one of the group consisting of metal oxide, aluminum oxide, metal nitride, silicon oxide, boron nitride, zirconium oxide, silicon nitride, diamond, and aluminum nitride.

Example 12 is the semiconductor device module according to any one of the preceding Examples, wherein the leads are formed as J-leads, gull wing leads, or through-hole leads.

Example 13 is a semiconductor device module, comprising a semiconductor die, a leadframe comprising a plurality of leads, a heat dissipation element, and an encapsulant embedding the semiconductor die and first portions of the leads, wherein two or more recesses are formed in second portions of the leads which second portions are not embedded by the encapsulant, the recesses being configured to induce or enhance a spring support of the leads.

Example 14 is the semiconductor device module according to Example 13, wherein the leads are formed as gull wing leads, J-leads, or through-hole leads.

Example 15 is the semiconductor device module according to Example 13 or 14, wherein each one of the leads is formed as a gull wing lead and comprises a first recess which comprises the form of a groove located on an upper surface of an upper horizontal portion of the lead and a second recess which comprises the form of a groove located on a lower surface of a bent portion between the upper horizontal portion and a downward portion of the lead.

Example 16 is the semiconductor device module according to Example 13 or 14, wherein each one of the leads is formed as a J-lead and comprises a first recess which comprises the form of a groove located on an upper surface of an upper horizontal portion of the lead and a second recess which comprises the form of a groove located on a lower surface of the upper horizontal portion of the lead.

Example 17 is the semiconductor device module according to any one of Examples 13 to 16, wherein a lowermost surface of the leads lies in a plane which is located below a lowermost surface of the encapsulant.

Example 18 is the semiconductor device module according to anyone of Examples 13 to 17, wherein the heat dissipation element is exposed by the encapsulant.

Example 19 is the semiconductor device module according to anyone of Examples 13 to 18, wherein the heat dissipation element comprises a die pad or a clip.

a semiconductor power module,

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device module, comprising:

an application board;

a plurality of semiconductor device packages disposed on the application board, each one of the semiconductor device packages comprising a semiconductor die, a leadframe comprising a plurality of leads that each comprise a spring support, a heat dissipation element, and an encapsulant embedding the semiconductor die and first portions of the leads;

an external heatsink; and one or more thermally conductive interface layers disposed between the semiconductor device package and the heatsink, wherein the spring support is induced or enhanced by two or more recesses formed in second portions of the leads which second portions are not embedded by the encapsulant.

2. The semiconductor device module according to claim 1, wherein an interface layer of the one or more thermally conductive interface layers is directly attached to an upper main face of the semiconductor device package and directly attached to a lower main face of the heatsink.

3. The semiconductor device module according to claim 2, wherein the interface layer comprises a compressibility of less than 10% or less than 8% or less than 5%.

4. The semiconductor device module according to claim 1, wherein the heat dissipation element is exposed by the encapsulant.

5. The semiconductor device module according to claim 1, wherein the heat dissipation element comprises a die carrier or a clip.

6. The semiconductor device module according to claim 2, wherein the interface layer comprises one common interface layer which is disposed between each one of the semiconductor device packages and the heatsink.

7. The semiconductor device module according to claim 1, wherein the one or more thermally conductive interface layers comprises a plurality of interface layers wherein each one of the interface layers from the plurality is disposed between one of the semiconductor device packages and the heatsink.

8. The semiconductor device module according to claim 1, wherein the one or more thermally conductive interface layers are electrically insulating.

9. The semiconductor device module according to claim 1, wherein the one or more thermally conductive interface layers comprise a material which comprises one or more elements out of a group consisting of a plastic, a silicone, a polyimide, a resin, and an epoxy resin.

10. The semiconductor device module according to claim 1, wherein the one or more interface layers comprise a material matrix filled with filler particles, in particular filler particles comprising at least one of the group consisting of metal oxide, aluminum oxide, metal nitride, silicon oxide, boron nitride, zirconium oxide, silicon nitride, diamond, and aluminum nitride.

11. The semiconductor device module according to claim 1, wherein the leads are formed as J-leads, gull wing leads, or through-hole leads.

12. A semiconductor device package comprising:

a semiconductor die a leadframe comprising a plurality of leads;

a heat dissipation element; and an encapsulant embedding the semiconductor die and first portions of the leads; wherein two or more recesses are formed in second portions of the leads which second portions are not embedded by the encapsulant, the recesses being configured to induce or enhance a spring support of the leads.

13. The semiconductor device package according to claim 12, wherein the leads are formed as gull wing leads, J-leads, or through-hole leads.

14. The semiconductor device package according to claim 12, wherein each one of the leads is formed as a gull wing lead and comprises a first recess which comprises the form of a groove located on an upper surface of an upper horizontal portion of the lead and a second recess which comprises the form of a groove located on a lower surface of a bent portion between the upper horizontal portion and a downward portion of the lead.

15. The semiconductor device package according to claim 12, wherein each one of the leads is formed as a J-lead and comprises a first recess which comprises the form of a groove located on an upper surface of an upper horizontal portion of the lead and a second recess which comprises the form of a groove located on a lower surface of the upper horizontal portion of the lead.

16. The semiconductor device package according to claim 12, wherein a lowermost surface of the leads lies in a plane which is located below a lowermost surface of the encapsulant.

17. The semiconductor device package according to claim 12, wherein the heat dissipation element is exposed by the encapsulant.

18. The semiconductor device package according to claim 12, wherein the heat dissipation element comprises a die pad or a clip.

* * * * *